United States Patent [19]

Shannon, Jr.

[11] 3,953,065

[45] Apr. 27, 1976

[54] OFFSET PLATE RACK AND HOLDERS

[76] Inventor: Edward J. Shannon, Jr., 3104 Jessica, Metoirie, La. 70003

[22] Filed: Sept. 25, 1974

[21] Appl. No.: 509,350

[52] U.S. Cl. ................................. 294/1 R; 211/45; 211/113
[51] Int. Cl.² ........................................... A47F 5/08
[58] Field of Search ............... 294/5.5, 16, 19 R, 79, 294/81 R, 86 R, 1 R; 211/1, 45, 60 A, 89, 113, 123, 124; 248/309, 312, 313, 316 B, 317, 320, 340, DIG. 3

[56] References Cited
UNITED STATES PATENTS

| 2,483,242 | 9/1949 | Smith | 211/89 X |
| 2,483,303 | 9/1949 | Rysick | 211/89 X |
| 2,580,193 | 12/1951 | Richterkessing | 211/113 |
| 2,626,713 | 1/1953 | Peacock | 211/89 |
| 3,195,733 | 7/1965 | Best | 211/45 |
| 3,312,434 | 4/1967 | Simon | 248/316 B X |
| 3,341,242 | 9/1967 | Carson | 294/16 |
| 3,477,757 | 11/1969 | English | 294/19 R |

Primary Examiner—Evon C. Blunk
Assistant Examiner—Johnny D. Cherry
Attorney, Agent, or Firm—Clarence A. O'Brien; Harvey B. Jacobson

[57] ABSTRACT

An offset printing plate rack and holder system having at least one plate holder provided with plate gripping clamps and selectively supportable on a rack. An aperture in the plate holder is arranged for receiving an end of a pointer used for placing the holder on, and removing the holder from, the rack.

5 Claims, 8 Drawing Figures

OFFSET PLATE RACK AND HOLDERS

BACKGROUND OF THE INVENTION

1. Field of the Invention

The present invention relates generally to a storage system, and particularly to a rack and holder system for storing offset plates used in printing prior to the plates being placed on the cylinder of a printing press.

2. Description of the Prior Art

In conjunction with printing presses, and particularly those presses using photographically produced plates and generally referred to as offset printing presses, it is frequently necessary to store the plates used in the press for varying lengths of time. As a result, the problem arises in storing these plates in a safe, convenient, out-of-the-way manner, while retaining the plates in such a manner that they may be easily located when needed.

It has been proposed to provide cabinet-like storage apparatus for holding such plates. Such a cabinet structure, however, consumes valuable floor space, and a known proposal of a storage cabinet for printing plates requires that the plates be specially modified in order to be hung in the cabinet.

Prior patents believed pertinent to this invention are as follows:

| | | |
|---|---|---|
| 1,070,506 | J. A. McIntosh | Aug. 19, 1913 |
| 2,336,537 | C. A. Fowler | Dec. 14, 1943 |
| 2,962,335 | H. R. Benson | Nov. 29, 1960 |
| 2,964,198 | L. C. Eisbart | Dec. 13, 1960 |
| 3,341,242 | R. M. Carson | Sept. 12, 1967 |

SUMMARY OF THE INVENTION

It is an object of the present invention to provide a uniform system for storing offset printing plates, and the like, prior to placement of the plates on a press cylinder.

It is another object of the present invention to provide a uniform system for storing offset printing plates that saves floor space, prevents damage to the plates, and reduces time spent in locating a particular plate.

It is still another object of the present invention to provide a uniform system for storing offset printing plates that is easy to install, requires little maintenance, and is adaptable to any plant situation involving storing or inventory procedures.

These and other objects are achieved according to the present invention by providing an offset plate rack and holder system having; a plate holder provided with a gripping arrangement for holding an offset plate; and a rack provided with a retaining arrangement for supporting a plate holder.

According to a preferred embodiment of the present invention, the rack is a longitudinally extending element, such as a bar, and the holder arrangement includes at least one pair of spaced, co-directionally extending, substantially parallel pins. Advantageously, there are a plurality of such pairs of pins arranged along the longitudinal extent of the bar, and the like, for simultaneously holding a plurality of plate holders.

Each plate holder advantageously has a body member provided with an enlarged head portion forming shoulders arranged for engagement with the pins and suspending the body member on the rack. The gripping arrangement preferably includes a pair of spring-biased clamps mounted on opposite sides of a portion of the body member spaced from the head portion and arranged for gripping the plates in such a manner that the plates extend downwardly from the rack and the associated plate holder.

The head portion of the plate holder is advantageously provided with an aperture arranged for receiving an end of a pointer adapted for manipulating the plate holder and placing same on, and removing it from, the rack.

These together with other objects and advantages which will become subsequently apparent reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
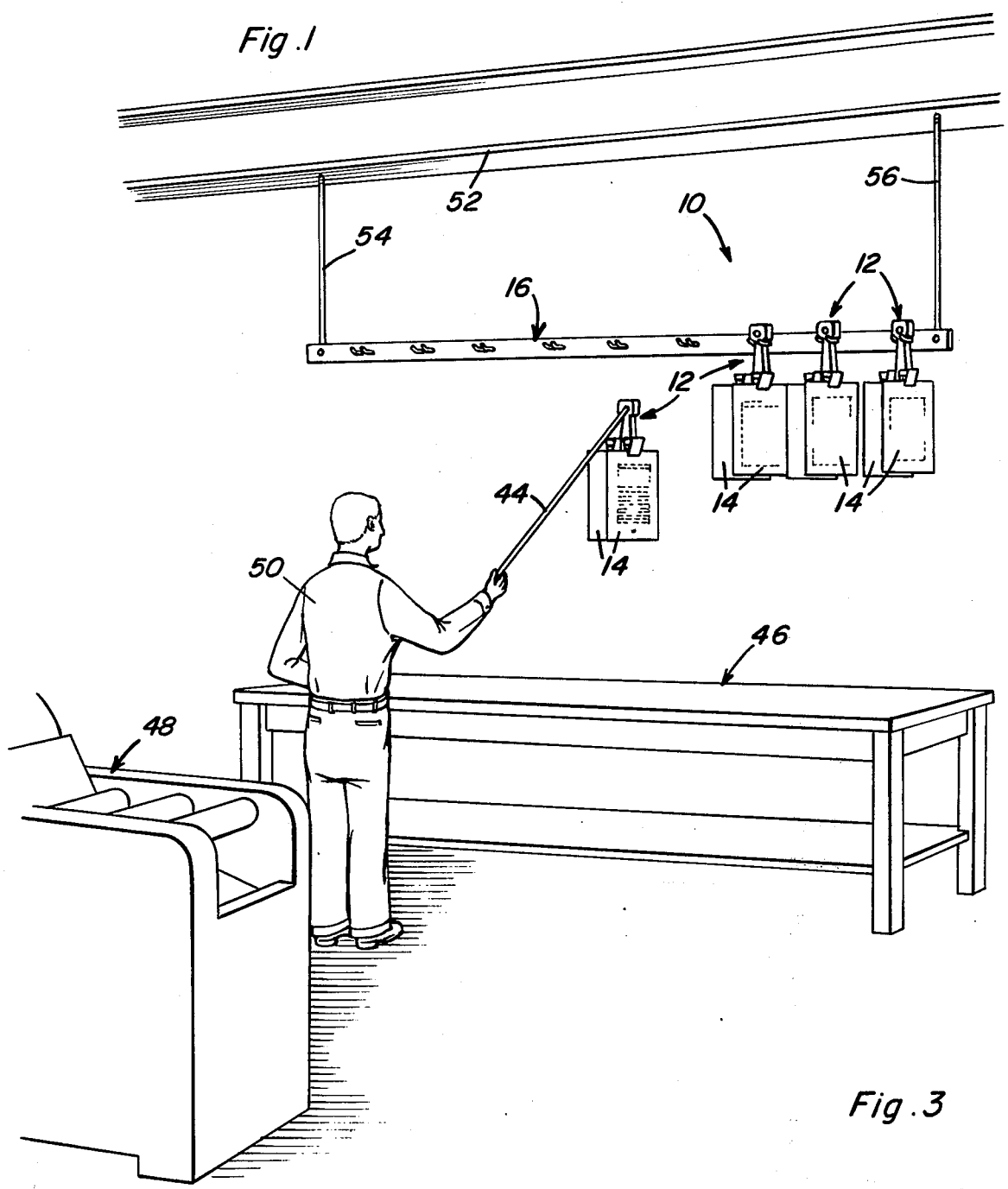
FIG. 1 is a fragmentary, perspective view showing an offset plate rack and holder system according to the present invention.

Referring now more particularly to FIG. 1 of the drawings, an offset plate rack and holder system 10 according to the present invention is shown as including a plurality of plate holders 12 each shown as provided with a pair of gripping clamps 28 and 30 arranged for holding offset plates 14. While each holder 12 is illustrated as having a pair of clamps, it is to be understood that only one such clamp could be employed on a holder 12 if so desired. System 10 further includes a rack 16 provided with a retaining arrangement for selectively supporting plate holders 12.

Figure 2:
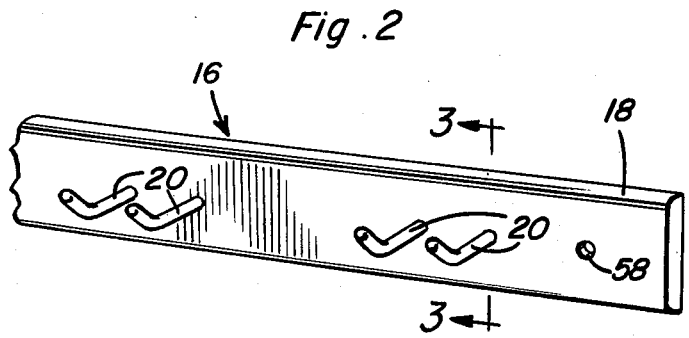
FIG. 2 is a fragmentary, perspective view showing a portion of a rack used in a rack and holder system according to the present invention.
Figure 3:
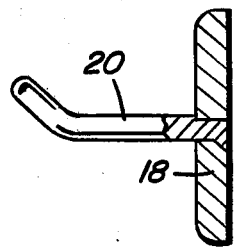
FIG. 3 is a sectional view taken generally along the line 3—3 of FIG. 2.
Figure 4:
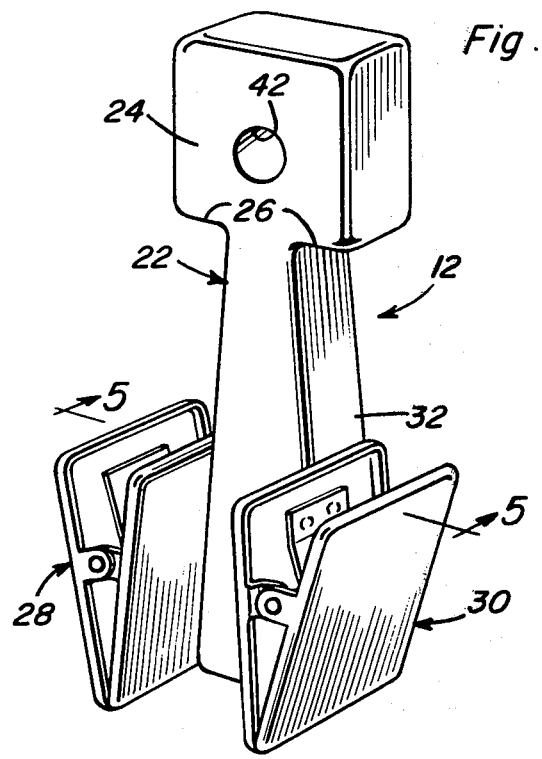
FIG. 4 is a perspective view of a plate holder according to the present invention.
Figure 5:
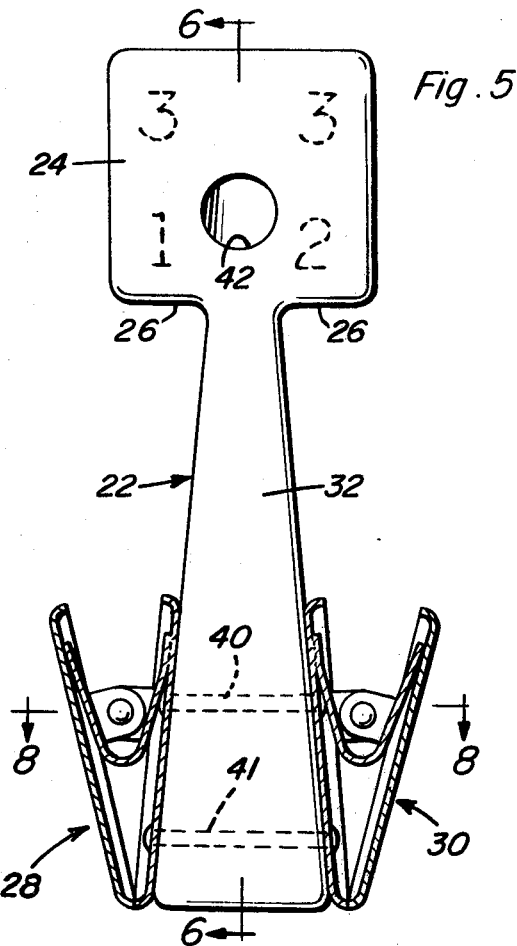
FIG. 5 is a sectional view taken generally along the line 5—5 of FIG. 4.
Figure 6:
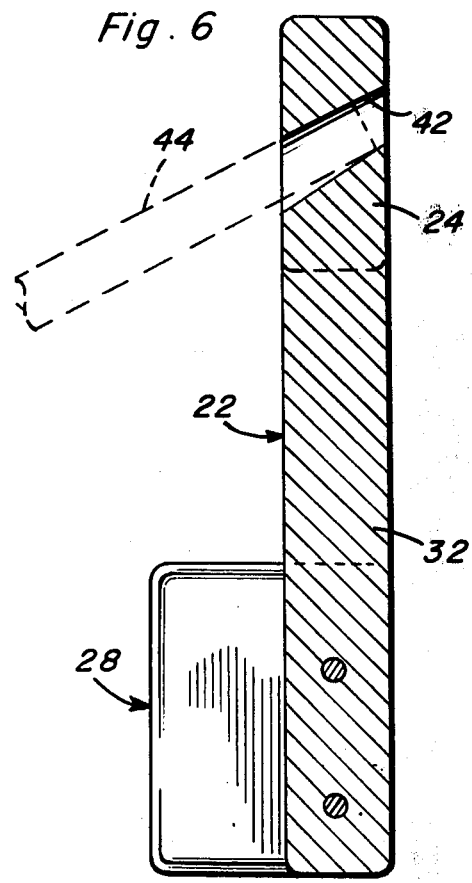
FIG. 6 is a perspective view taken generally along the line 6—6 of FIG. 5.
Figure 7:
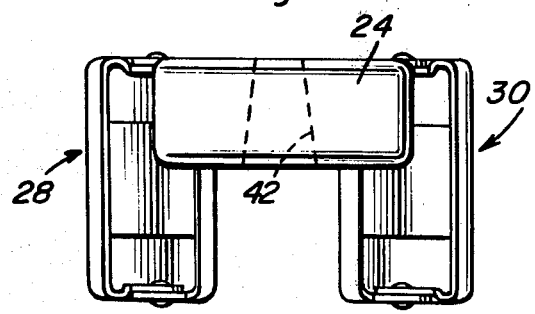
FIG. 7 is a top plan view of the plate holder of FIGS. 4 through 6.
Figure 8:
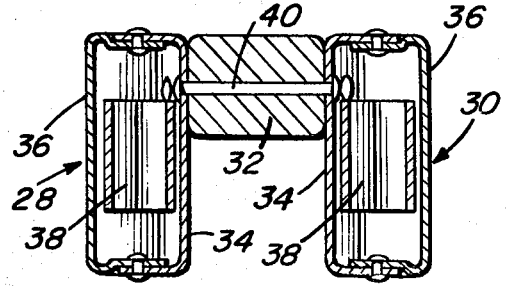
FIG. 8 is a sectional view taken generally along the line 8—8 of FIG. 5.

Referring now to FIGS. 2 and 3 of the drawings, rack 16 is advantageously a longitudinally extending element 18, such as the illustrated bar, provided with a plurality of pairs of spaced, co-directionally extending, substantially parallel pins 20. As can be readily appreciated from FIGS. 1 and 2 of the drawings, the pairs of pins 20 are spaced out along the longitudinal extent of element 18. The outer, or free, ends of the centilever mounted pins 20 are advantageously turned upwardly as is perhaps best seen from FIG. 3 for retaining holders 12 in a manner to be described in greater detail below.

FIGS. 4 through 8 of the drawings show a preferred form of the holders 12. As illustrated, each holder 12 has a body member 22 provided with an enlarged head portion 24 forming shoulders 26 arranged for engagement with pins 20 and suspending body member 22 on rack 16. The gripping clamps 28 and 30 comprise a pair of spring-biased clamps mounted on opposite sides of a portion 32, which is advantageously wedge-shaped or diverging downwardly, of body member 22 spaced from, but connected to, head portion 24. In this manner, a pair of offset plates 14 may be held by each plate holder 12.

Each clamp 28, 30 includes a pair of jaws 34 and 36 (see FIG. 8) pivotally connected together in spaced relationship by pivots projecting from median portions of the jaws 34, 36. A leaf spring 38 has its ends connected to jaw 34 and 36 so as to normally bias the jaws toward an article gripping position. Rhis is the position shown in FIGS. 4 through 8 of the drawings. Rivets 40 and 41 are advantageously employed to connect clamps 28 and 30 to one another and to portion 32 of body member 22. Further, clamps 28 and 30 may be offset with respect to body member 22 so as to facilitate storage of plates 14 adjacent a wall, and the like.

Head portion 24 is advantageously provided with an aperture 42 arranged for receiving an end of a manipulating pointer 44, the purpose of which pointer will be described in greater detail below.

Referring again to FIG. 1 of the drawings, rack 16 may be arranged above a worktable 46, and the like, so as to not interfere with available floor space. Plates 14 may be transferred between rack 16, and the area of worktable 46, to a conventional press 48, and the like, by an operator 50 manipulating pointer 44 by placing the end of same in apertures 42 of holders 12. As illustrated in FIG. 1, a convenient manner of installing rack 16 is to hang same from a ceiling joist 52, and the like, as by suitable cables 54 and 56. Holes 58 (FIG. 2) may be provided in element 18 of rack 16 to facilitate attachment of cables 54, 56 to the element.

When the plate maker, or other designated employee, delivers a plate 14 to press 48, he will select a holder 12 and place the corresponding number of the holder 12 on a job ticket. The latter may be an envelope, and the like, as conventionally used in printing plants. An example of the manner in which holders 12 may be coded, or provided with an identifying number, is shown by the broken-line letters in FIG. 5 of the drawings. In the illustrated example, the left-hand clamp 28 would hold a plate identified by the number "31" provided on the left-hand portion of head portion 24, while the right-hand clamp 30 in FIG. 5 would hold a plate identified by the number "32" provided on the right-hand portion of the head portion 24. Using pointer 44, the operator 50 will place holder 12 with the plate or plates 14 attached on rack 16 in its respective place. This place is determined by the sequential numbering of the holders.

The above steps can be repeated until enough plates 14 to perform several printing jobs are in place on the rack 16.

As the pressman prepares for the next job, he refers to a job ticket for the plate holder number, and then uses the pointer 44 and retrieves that particular plate from rack 16 without any loss of time, searching, or damaging the plate.

In printing plants where the plates 14 are not reused, the pressman, upon completion of a particular job, will remove the plate holder number from the job ticket, thus freeing that plate holder 12 for a new job.

As can be readily appreciated from the above description and from the drawings, an offset plate rack and holder system according to the present invention greatly facilitates the handling and storage of offset printing plates, and the like.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed as new is as follows:

1. An offset plate rack and holder system, comprising, in combination:
   a. a plurality of plate holders each provided with gripping means for holding an offset plate; and
   b. an elongated rack provided with longitudinally spaced retaining means for supporting a plate holder, each retaining means including at least one pair of spaced, co-directionally extending, substantially parallel pins, each plate holder including a body member provided with an enlarged head portion forming shoulders arranged for engagement with the pins of a corresponding retaining means for suspending the body member on the rack, said gripping means including a pair of spring-biased clamps mounted on opposite sides of a portion of the body member spaced from the head portion, and a pointer for manipulating the plate holders, and wherein the head portion of each plate holder being provided with an aperture arranged for receiving an end of the manipulating pointer.

2. An offset plate rack and holder system, comprising, in combination:
   a. a plate holder provided with gripping means for holding an offset plate; and
   b. a rack provided with retaining means for supporting a plate holder, said plate holder including a body member provided with an enlarged head portion forming shoulders arranged for engaging the retaining means of the rack and suspending the body member on the rack, said gripping means including a pair of spring-biased clamps mounted on opposite sides of a portion of the body member spaced from the head portion, and a pointer for manipulating the plate holder, the head portion of said plate holder being provided with an aperture arranged for receiving an end of the manipulating pointer.

3. The combination of claim 2 wherein said aperture is longitudinally tapered, a pointer for manipulating said plate holder, one end of said pointer including a tapered terminal end portion removably seatable in said aperture.

4. An offset plate rack and holder system, comprising, in combination:
   a. a plate holder provided with gripping means for holding an offset plate; and
   b. a rack provided with retaining means for supporting a plate holder, said plate holder including a body member having support portions arranged for engaging the retaining means of the rack and suspending the body member on the rack, said gripping means including a pair of spring-biased clamps mounted on opposite sides of said body member below said support portions, a pointer for manipulating the plate holder, the body of said plate holder being provided with an aperture spaced above said support portions for receiving an end of the manipulating pointer.

5. The combination of claim 4 wherein said aperture is inclined and tapers toward its upper end, one end of said pointer including a tapered terminal end portion removably seatable in said aperture.

* * * * *